US012727249B2

(12) United States Patent
Yoon et al.

(10) Patent No.: US 12,727,249 B2
(45) Date of Patent: Sep. 1, 2026

(54) DISPLAY APPARATUS

(71) Applicant: Samsung Display Co., Ltd., Yongin-Si (KR)

(72) Inventors: Juwon Yoon, Yongin-si (KR); Guanghai Jin, Yongin-si (KR); Junghun Noh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 306 days.

(21) Appl. No.: 18/427,891

(22) Filed: Jan. 31, 2024

(65) Prior Publication Data

US 2024/0282779 A1 Aug. 22, 2024

(30) Foreign Application Priority Data

Feb. 20, 2023 (KR) ........................ 10-2023-0022447

(51) Int. Cl.
*H10D 86/60* (2025.01)
*H10D 86/40* (2025.01)
*H10W 90/00* (2026.01)

(52) U.S. Cl.
CPC ........... *H10D 86/60* (2025.01); *H10D 86/441* (2025.01); *H10W 90/00* (2026.01)

(58) Field of Classification Search
CPC ..... H10D 86/60; H10D 86/441; H10W 90/00; G09G 3/3225; G09G 2300/043; G09G 2320/0233; G09G 3/3258; G09G 3/3233; H10K 59/1213
See application file for complete search history.

(56) References Cited

U.S. PATENT DOCUMENTS 8,450,121 B2 5/2013 Chung
9,734,758 B2 8/2017 Imai et al.
10,223,970 B2 3/2019 Kim
10,515,583 B2 12/2019 Hwang et al.
11,367,381 B2 6/2022 Cho et al.
2006/0133133 A1* 6/2006 Yamada .................. G11C 11/22 365/149
2008/0315759 A1* 12/2008 Chung ................. G09G 3/3233 313/504
2011/0148949 A1* 6/2011 Matsui ................. G09G 3/3233 345/690
2012/0009691 A1* 1/2012 Chung ................. G09G 3/3233 257/E21.531
2014/0002332 A1 1/2014 Huang et al.
2014/0218415 A1 8/2014 Pak
2016/0055791 A1* 2/2016 Kishi ................... G09G 3/3241 345/212

(Continued)

FOREIGN PATENT DOCUMENTS

JP 2008-058446 A 3/2008
JP 4984873 B2 7/2012

(Continued)

*Primary Examiner* — Victor A Mandala
(74) *Attorney, Agent, or Firm* — Innovation Counsel LLP

(57) ABSTRACT

Provided is a display apparatus including: a data line extending in a first direction; a driving voltage line extending in the first direction; and a plurality of pixels connected to the data line and the driving voltage line and arranged adjacent to each other in the first direction, wherein threshold voltages of driving transistors of the plurality of pixels arranged along the first direction gradually changing.

20 Claims, 10 Drawing Sheets

(56) References Cited

U.S. PATENT DOCUMENTS

| | | | | |
|---|---|---|---|---|
| 2018/0190185 | A1* | 7/2018 | Ko | G09G 3/3233 |
| 2019/0131372 | A1* | 5/2019 | Toyomura | G09G 3/20 |
| 2019/0180692 | A1* | 6/2019 | Fujii | H10K 59/131 |
| 2022/0246074 | A1* | 8/2022 | Xuan | G09G 3/20 |
| 2022/0415254 | A1* | 12/2022 | Jeon | G09G 3/3233 |
| 2022/0415991 | A1* | 12/2022 | Kwon | G09G 3/3266 |
| 2024/0038174 | A1* | 2/2024 | Zhou | G09G 3/3233 |
| 2024/0265875 | A1* | 8/2024 | Liu | G09G 3/3233 |
| 2024/0268149 | A1* | 8/2024 | Liu | H10K 59/131 |

FOREIGN PATENT DOCUMENTS

| | | | |
|---|---|---|---|
| JP | 6142235 | B2 | 6/2017 |
| KR | 10-0873705 | B1 | 12/2008 |
| KR | 10-2014-0099077 | A | 8/2014 |
| KR | 10-2017-0078891 | A | 7/2017 |
| KR | 10-2256279 | B1 | 5/2021 |
| KR | 10-2021-0085514 | A | 7/2021 |

* cited by examiner

DISPLAY APPARATUS

CROSS-REFERENCE TO RELATED APPLICATION

This application is based on and claims priority under 35 U.S.C. § 119 to Korean Patent Application No. 10-2023-0022447, filed on Feb. 20, 2023, in the Korean Intellectual Property Office, the disclosure of which is incorporated by reference herein in its entirety.

BACKGROUND

1. Field

One or more embodiments relate to a pixel and a display apparatus including the same.

2. Description of the Related Art

Recently, the use of display apparatuses has been diversifying. In addition, because the thickness of a display apparatus is reduced and the weight thereof is light, the range of use thereof is being widened.

As the display apparatus is variously used, various methods of designing the shape of the display apparatus can be provided. Also, functions capable of being connected or linked to the display apparatus are increasing.

SUMMARY

One or more embodiments provide a display apparatus having improved display quality. However, this objective is merely illustrative, and the scope of the present disclosure is not limited thereto.

Additional aspects will be set forth in part in the description which follows and, in part, will be apparent from the description, or may be learned by practice of the presented embodiments of the disclosure.

According to one or more embodiments, a display apparatus includes a data line extending in a first direction, a driving voltage line extending in the first direction, and a plurality of pixels connected to the data line and the driving voltage line and arranged adjacent to each other in the first direction, wherein threshold voltages of driving transistors of the plurality of pixels arranged in the first direction may be gradually changing.

Threshold voltages of driving transistors of the plurality of pixels may increase gradually along a transmission direction of a driving voltage supplied from the driving voltage line.

Each of the driving transistors may include a semiconductor layer, a first gate electrode, and a second gate electrode disposed between the semiconductor layer and the first gate electrode.

The amount of charges stored in second gate electrodes of the plurality of pixels may decrease along the transmission direction of the driving voltage supplied from the driving voltage line.

Each of the plurality of pixels may further include a first transistor connected between the data line and a first gate electrode of the driving transistor, and a second transistor connected between the driving transistor and a light-emitting diode, and the driving transistor may be connected between the driving voltage line and the second transistor.

The second gate electrode may be a floating electrode.

Each of the driving transistors may be a P-channel transistor.

The voltage level of a driving voltage supplied from the driving voltage line may decrease along the transmission direction of the driving voltage supplied from the driving voltage line.

According to one or more embodiments, a display apparatus includes a data line extending in a first direction, a driving voltage line extending in the first direction, and a plurality of pixels connected to the data line and the driving voltage line and arranged adjacent to each other in the first direction, wherein voltage-current curves of driving transistors of the plurality of pixels arranged in the first direction may be gradually shifting along a direction of the horizontal axis.

The voltage-current curves of the driving transistors of the plurality of pixels may move to a left of the horizontal axis along the transmission direction of the driving voltage supplied from the driving voltage line.

The driving transistor may be a P-channel transistor.

Each of the driving transistors may include a semiconductor layer, a first gate electrode, and a second gate electrode disposed between the semiconductor layer and the first gate electrode.

The second gate electrode may be a floating electrode.

The amount of charges stored in second gate electrodes of the plurality of pixels may decrease along the transmission direction of a driving voltage supplied from the driving voltage line.

Each of the plurality of pixels may further include a first transistor connected between the data line and a first gate electrode of the driving transistor, a second transistor connected between the driving transistor and a light-emitting diode, and a capacitor connected between a first gate electrode of the driving transistor and the driving voltage line, and the driving transistor may be connected between the driving voltage line and the second transistor.

Threshold voltages of driving transistors of the plurality of pixels may increase gradually along the transmission direction of the driving voltage supplied from the driving voltage line.

According to one or more embodiments, a display apparatus includes a pixel unit including a plurality of pixels, a data driver connected to data lines connected to the pixels, and a power supply circuit connected to driving voltage lines connected to the pixels, wherein each of the plurality of pixels may include a first transistor connected between a corresponding driving voltage line of the driving voltage lines and a light-emitting diode and including a first gate electrode and a second gate electrode, a second transistor connected to a corresponding data line of the data lines and a first gate electrode of the first transistor, and a third transistor connected between the driving transistor and the light-emitting diode, and threshold voltages of driving transistors of the plurality of pixels may be gradually changing along a transmission direction of a driving voltage supplied from the driving voltage line.

Amount of charges stored in second gate electrodes of the plurality of pixels may decrease in along transmission direction of the driving voltage supplied from the driving voltage line.

The second gate electrode may be a floating electrode.

The driving transistor may be a P-channel transistor. The threshold voltages of the driving transistors of the plurality of pixels may gradually increase along the transmission direction of the driving voltage supplied from the driving voltage line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
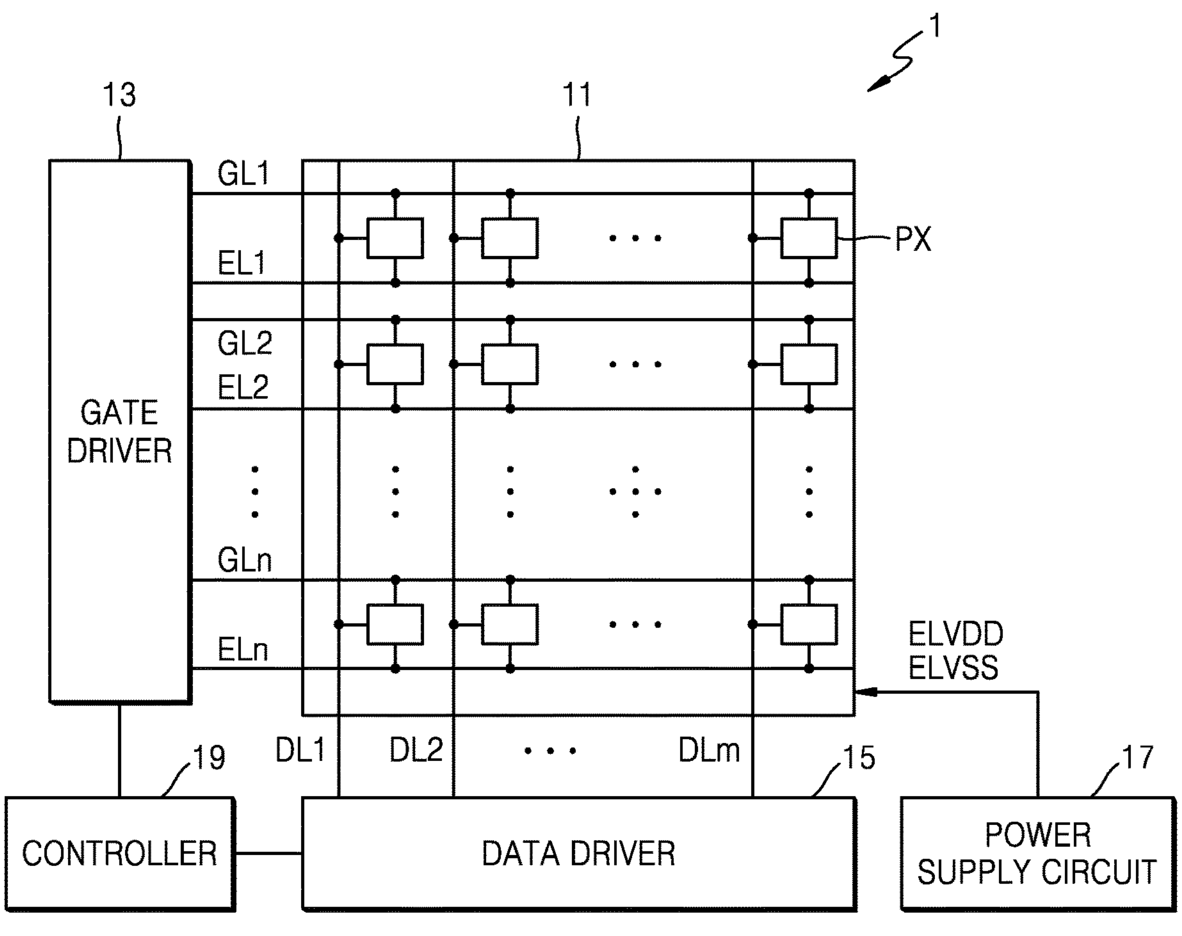
FIGS. 1 and 2 are views schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

In the following embodiments, the terms of the first and second, etc. were used for the purpose of distinguishing one element from other element s, not a limited sense.

In the following embodiments, the singular expression includes a plurality of expressions unless the context is clearly different.

In the following embodiments, the terms such as comprising or having are meant to be the features described in the specification, or the element s are present, and the possibility of one or more other features or elements will be added, is not excluded in advance.

In the following embodiments, when a portion such as a layer, a region, an element or the like is on other portions, this is not only when the portion is on other elements, but also when other elements are interposed therebetween.

In the drawings, for convenience of explanation, the sizes of elements may be exaggerated or reduced. For example, since the size and thickness of each element shown in the drawings are arbitrarily indicated for convenience of explanation, the present disclosure is not necessarily limited to the illustration.

In the present specification, "A and/or B" is A, B, or A and B. In addition, in the present specification, "at least one of A and B" is A, B, or A and B.

In the following embodiments, when X and Y are connected, the case where X and Y are electrically connected, the case where X and Y are functionally connected, and the case where X and Y are directly connected may be included. Here, X and Y may be objects (for example, devices, elements, circuits, wires, electrodes, terminals, conductive films, layers, etc.). Thus, the present disclosure is not limited to a predetermined connection relationship, for example, the connection relationship indicated in the drawings or the detailed description, and may also include other than the connection relationships indicated in the drawings or the detailed description.

When X and Y are electrically connected, for example, one or more elements (for example, switches, transistors, capacitive elements, inductors, resistance elements, diodes, etc.) enabling electrical connection of X and Y may be connected between X and Y.

In the following embodiment, "ON" used in association with a device state may refer to the activated state of the element, and "OFF" may refer to the deactivated state of the element. "ON" used in connection with a signal received by the element may refer to a signal activating the element, and "OFF" may refer to a signal deactivating the element. The element may be activated by a high level voltage or a low level voltage. For example, a P-channel transistor (P-type transistor) is activated by a low-level voltage, and an n-channel transistor (N-type transistor) is activated by a high-level voltage. Thus, it should be understood that the "ON" voltage for the P-type transistor and the N-type transistor is the opposite (low to high) voltage level.

In the following embodiments, the case where a wiring "extends in a first direction or a second direction" refers to not only extending in a straight line shape, but also extending in a zigzag or curved shape along the first direction or the second direction.

In the following embodiments, when referred to as a "planar", it means when a target portion is viewed from above, and when referred to as a "cross-sectional view", it means when a cross section of the target portion cut vertically is viewed from a side. In the following embodiments, "overlap" includes "planar" and "cross-sectional" overlap.

In the following embodiments, the x-axis, the y-axis, and the z-axis are not limited to three axes on a Cartesian coordinate system, and may be interpreted in a broad sense including the same. For example, the x-axis, the y-axis, and the z-axis may be perpendicular to each other, but may refer to different directions that are not orthogonal to each other.

In the present specification, in the case where some embodiments may be implemented in the present specification, a specific process order may be performed differently from the order described. For example, two processes described in succession may be substantially performed at the same time, or in an opposite order to an order to be described.

The term "corresponding" in the detailed description and claims of the present disclosure has been used to specify elements arranged in the same area of the plurality of elements according to the context. For example, the fact that the first component corresponds to "corresponding" to the second element may mean that the second element is disposed in the same area as the first component.

A display apparatus according to embodiments of the present disclosure may be implemented as an electronic device such as a smartphone, a mobile phone, a smart watch, a navigation device, a game machine, a television (TV), a head unit for a vehicle, a notebook computer, a laptop computer, a tablet computer, a Personal Media Player (PMP), and a Personal Digital Assistant (PDA). In addition, the electronic device may be a flexible device.

Figure 2:
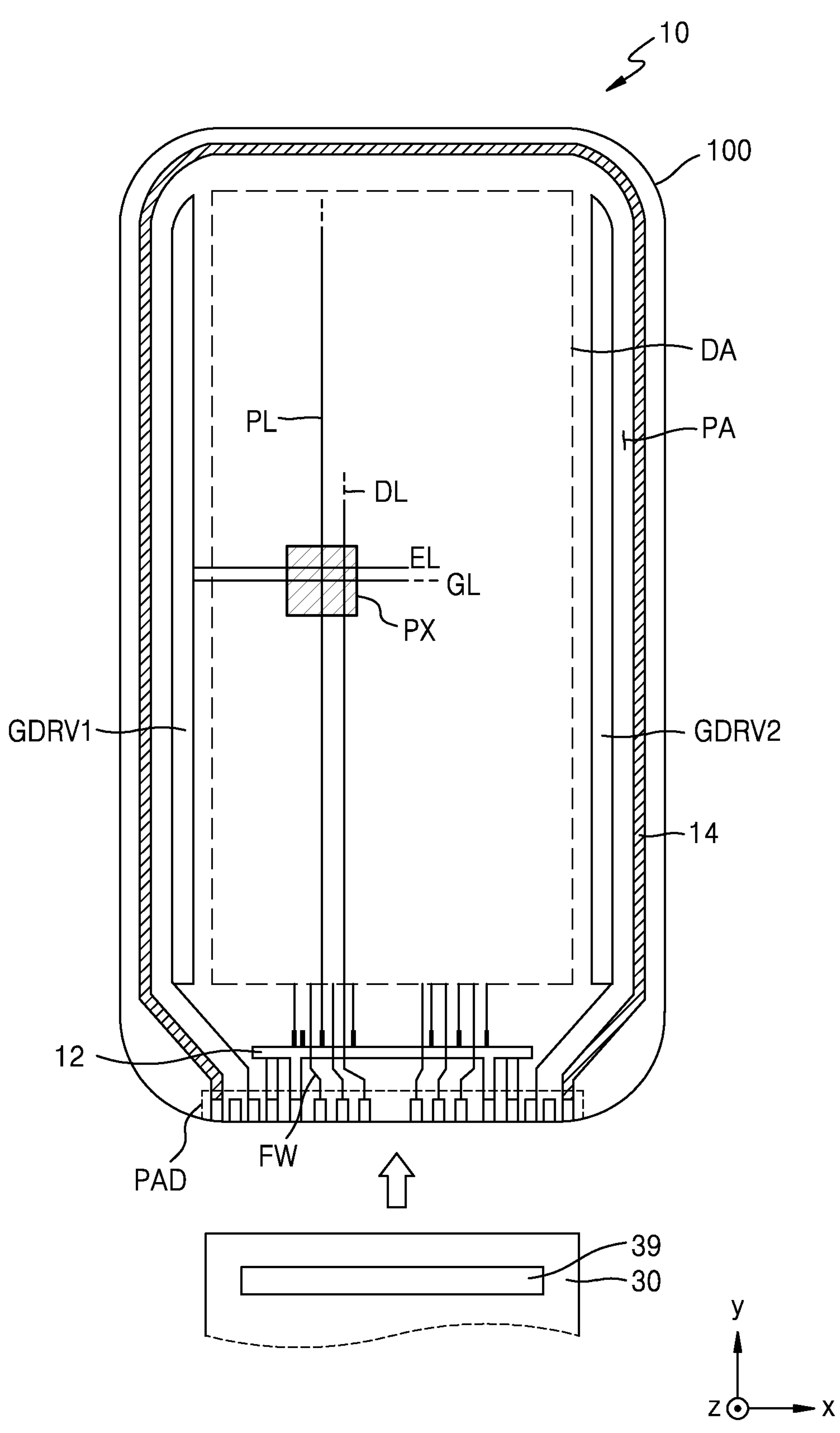

FIGS. 1 and 2 are views schematically illustrating a display apparatus according to an embodiment.

Referring to FIG. 1, a display apparatus 1 according to an embodiment may include a pixel unit 11, a gate driver 13, a data driver 15, a power supply circuit 17, and a controller 19.

A plurality of gate lines GL1 through GLn, a plurality of emission control lines EL1 to ELn, a plurality of data lines DL1 to DLm, and a plurality of pixels PX connected thereto may be arranged in the pixel unit 11. The plurality of pixels PX may be arranged in various forms such as a stripe arrangement, a pentile arrangement (a diamond arrangement), a mosaic arrangement, and the like. Each of the plurality of pixels PX may include an organic light-emitting diode (OLED) as a display element (a light-emitting device), and the OLED may be connected to a pixel circuit. The pixel circuit may include a plurality of transistors and at least one capacitor. The pixel PX may emit, for example, red, green, blue, or white light through the OLED. Each pixel PX may be connected to at least one corresponding gate line of the plurality of gate lines GL1 to GLn, a corresponding emission control line of the plurality of emission control lines EL1 to ELn, and a corresponding data line of the plurality of data lines DL1 to DLm.

Each of the gate lines GL1 to GLn may extend in an x direction (a row direction) and may be connected to the pixels PX located in the same row. Each of the gate lines GL1 to GLn may transmit a gate signal to the pixels PX in the same row. Each of the emission control lines EL1 to ELn may extend in an x direction (a row direction) and may be connected to the pixels PX located in the same row. Each of the emission control lines EL1 to ELn may transmit an emission control signal to the pixels PX in the same row.

Each of the data lines DL1 to DLm may extend in a y direction (a column direction) and may be connected to the pixels PX located in the same column. Each of the data lines DL1 to DLm may transmit data signals to the pixels PX in the same column in synchronization with the gate signals.

The gate driver 13 may be connected to the plurality of gate lines GL1 to GLn, may generate a gate signal in response to a control signal from the controller 19, and may sequentially supply the gate signal to the gate lines GL1 to GLn. The gate lines GL1 to GLn may be connected to a gate of a transistor included in the pixels PX. The gate driver 13 may be connected to the plurality of emission control lines EL1 to ELn, may generate an emission control signal in response to a control signal from the controller 19, and may sequentially supply the emission control signal to the emission control lines EL1 to ELn. The emission control lines EL1 to ELn may be connected to a gate of a transistor included in the pixels PX.

The gate signal and the emission control signal may be gate control signals for controlling turn-on and turn-off the transistor the gate of which is connected to the gate lines GL1 to GLn and the emission control lines EL1 to ELn. The gate signal and the emission control signal may be square wave signals including an on voltage at which the transistor may be turned on and an off voltage in which the transistor may be turned off. In an embodiment, the on voltage may be a low-level voltage (a first level voltage) or a high-level voltage (a second level voltage).

The data driver 15 may be connected to the plurality of data lines DL1 to DLm and may supply data signals to the data lines DL1 to DLm in response to a control signal from the controller 19. Data signals supplied to the data lines DL1 to DLm may be supplied to the pixels PX to which the gate signal is supplied. The data driver 15 may convert image data having a gray scale input from the controller 19 into a data signal having a voltage or current shape.

The power supply circuit 17 may generate voltages required for driving the pixels PX in response to the control signal from the controller 19. The power supply circuit 17 may generate a first driving voltage ELVDD and a second driving voltage ELVSS to supply the generated first driving voltage ELVDD and second driving voltage ELVSS to the pixels PX. The first driving voltage ELVDD may be a high-level voltage supplied to a first electrode (a pixel electrode or an anode) of the display element included in the pixel PX. The second driving voltage ELVSS may be a low-level voltage supplied to a second electrode (an opposite electrode or a cathode) of the display element included in the pixel PX.

The controller 19 may generate control signals based on signals input from the outside and may supply the control signals to the gate driver 13, the data driver 15, and the power supply circuit 17. A control signal output to the gate driver 13 may include a plurality of clock signals and a gate start signal. A control signal output to the data driver 15 may include a source start signal and clock signals.

As shown in FIG. 2, in an embodiment, the display apparatus 1 may include a display panel 10, and the display panel 10 may include a display area DA, and a peripheral area PA outside the display area DA. The display panel 10 may include a substrate 100, and the display area DA and the peripheral area PA may be defined in the substrate 100.

The pixels PX may be arranged in the display area DA of the substrate 100. The pixel unit 11 of FIG. 1 may be provided in the display area DA. One pixel PX may be connected to a gate line GL, an emission control line EL, a driving voltage line PL, and a data line DL.

Various conductive lines for transmitting electrical signals to be applied to the display area DA, outer circuits electrically connected to the pixel circuits, and pads to which a printed circuit board or a driver IC chip is attached, may be located in the peripheral area PA. For example, the gate driver 13, the data driver 15, the power supply circuit 17, and the controller 19 of FIG. 1 may be provided in the peripheral area PA.

In an embodiment, the gate driver 13 may include a first gate driver GDRV1 and a second gate driver GDRV2. The first gate driver GDRV1 and the second gate driver GDRV2 may be located at the left and right sides of the peripheral area PA with the display area DA disposed therebetween. In another embodiment, only one gate driver 13 may be provided at the left side or right side of the peripheral area PA.

In an embodiment, the peripheral area PA may be a kind of non-display area in which the pixels PX are not arranged. Some of the plurality of pixels PX may overlap the first gate driver GDRV1 and the second gate driver GDRV2 at at least one corner of the peripheral area PA. Thus, a dead area may be reduced and the display area DA may be extended.

One or both of the first gate driver GDRV 1 and the second gate driver GDRV 2 may be directly formed in the peripheral area PA of a substrate 100 during a process of forming transistors constituting the pixel circuit in the display area DA of the substrate 100.

A terminal portion PAD may be located at one side of the substrate 100. The terminal portion PAD may not be covered by an insulating layer and be exposed and may be connected to a display circuit board 30. A display driving portion 39 may be disposed in the display circuit board 30. The display driving portion 39 may be formed in the form of one or more integrated circuit (IC) chips which may be mounted on the display circuit board 30.

In an embodiment, the display circuit board 30 may be a flexible printed circuit board (FPCB), and the display driving portion 39 may include a data driver 15, a power supply circuit 17, and a controller 19. The data driver 15, the power supply circuit 17, and the controller 19 may be formed in the form of separate IC chips or one IC chip and may be disposed on the FPCB electrically connected to pads in the terminal portion PAD disposed at one side of the substrate 100. In another embodiment, the data driver 15, the power supply circuit 17, and the controller 19 may be arranged on the substrate 100 in a chip on glass (COG) or chip on plastic (COP) manner.

The display driving portion 39 may generate control signals to be transmitted to the first gate driver GDRV1 and the second gate driver GDRV2. The display driving portion 39 may generate data signals, and the generated data signals may be transmitted to pixel circuits of the pixels PX through fanout lines FW and data lines DL connected to the fanout lines FW.

The display driving portion 39 may supply a first driving voltage ELVDD to the first voltage supply line 12 and may supply a second driving voltage ELVSS to the second voltage supply line 14. The first driving voltage ELVDD may be applied to the pixel circuits of the pixels PX through the driving voltage lines PL connected to the first voltage supply line 12, and the second driving voltage ELVSS may be applied to the opposite electrode of the display elements through the second voltage supply line 14.

The first voltage supply line 12 may be connected to the terminal portion PAD and may extend in the x direction in the lower side of the display area DA. The second voltage supply line 14 may be connected to the terminal portion PAD, may have a loop shape of which one side is open, thereby partially surrounding the display area DA.

Figure 3:
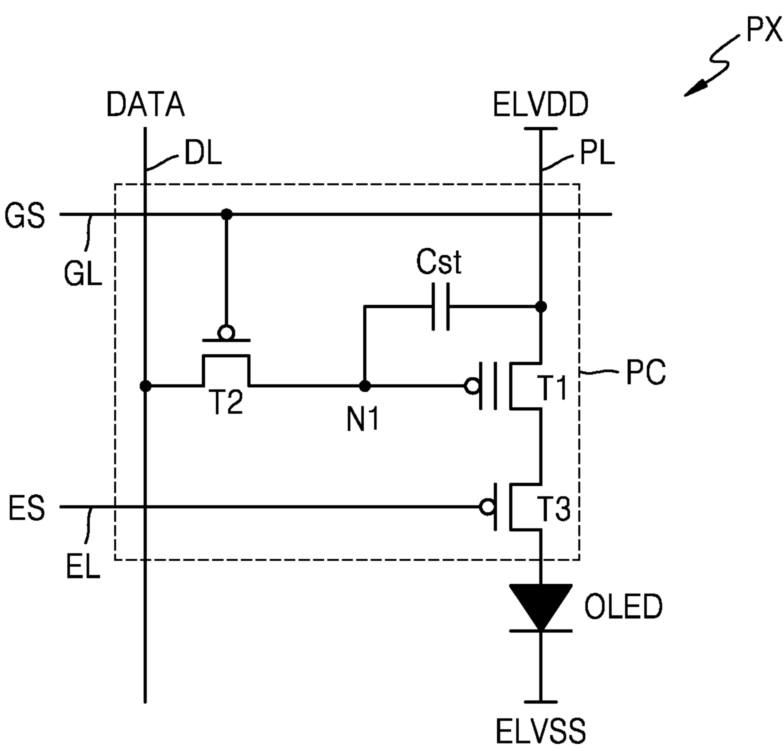
FIG. 3 is a circuit diagram of a pixel according to an embodiment.
Figure 4:
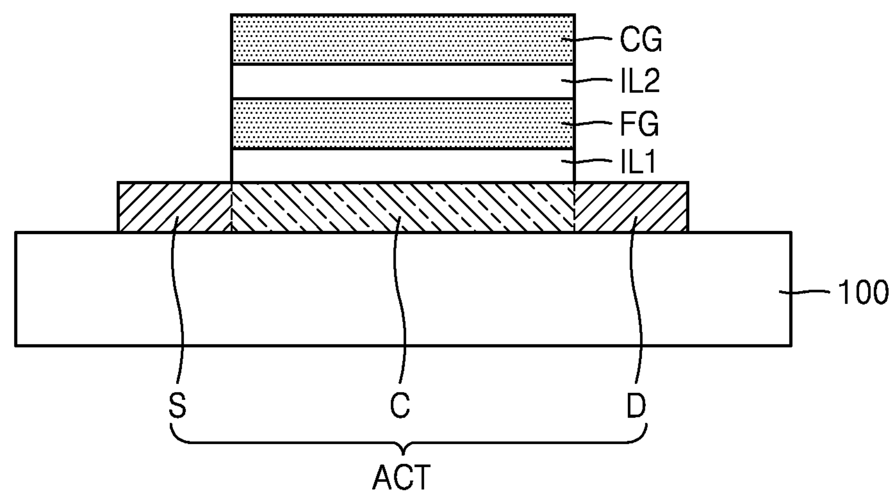
FIG. 4 is a view schematically illustrating a driving transistor according to an embodiment.

FIG. 3 is a circuit diagram of a pixel according to an embodiment. FIG. 4 is a view schematically illustrating a driving transistor according to an embodiment.

Referring to FIG. 3, a pixel PX may include a pixel circuit PC. The pixel circuit PC may include first through third transistors T1, T2, and T3, and a capacitor Cst. The pixel circuit PC may be connected to the data line DL, the gate line GL, and the emission control line EL. Also, the pixel circuit PC may be connected to the driving voltage line PL. The pixel circuit PC may be connected to the OLED which is a display element. The first transistor T1 may be a driving transistor, and the second transistor T2 and the third transistor T3 may be switching transistors. A first terminal of the transistor may be a source electrode or drain electrode, and a second terminal thereof may be an electrode different from the first terminal depending on the type (N-type or P-type) of the transistor and/or operating conditions. For example, when the first terminal is a source electrode, the second terminal may be a drain electrode.

The first through third transistors T1, T2, and T3 may include a semiconductor layer and a gate electrode insulated from the semiconductor layer. An insulating layer may be disposed between the semiconductor layer and the gate electrode. The semiconductor layer may include a source region and a drain region doped with impurities, and a channel region disposed between the source region and the drain region which is not doped with impurities. The gate electrode may overlap the channel region of the semiconductor layer. In an embodiment, the source region and the drain region of the semiconductor layer may serve as a source electrode and a drain electrode, respectively. In another embodiment, the source electrode and the drain electrode of each of the first through third transistors T1, T2, and T3 may be disposed on a different layer from the semiconductor layer, and connected to the source region and the drain region, respectively.

In an embodiment, the first through third transistors T1, T2, and T3 may be P-channel transistors.

The first transistor T1 may be connected between the driving voltage line PL and the OLED. The first transistor T1 may be connected between the driving voltage line PL and the third transistor T3. The first transistor T1 may be electrically connected to the OLED via the third transistor T3. The first transistor T1 may serve as a driving transistor, may receive a data signal DATA according to a switching operation of the second transistor T2, and may supply a driving current corresponding to the data signal DATA to the OLED.

As illustrated in FIG. 4, the first transistor T1 may include a semiconductor layer ACT disposed on the substrate 100, a first gate electrode CG as a control electrode, and a second gate electrode FG as a floating electrode. The floating electrode may be an electrode to which no voltage is applied or an ungrounded electrode and may be an electrode in an insulated state. The second gate electrode FG may be disposed between the semiconductor layer ACT and the first gate electrode CG. The second gate electrode FG may be a single layer or a plurality of layers including a low resistance material. The first gate electrode CG may be a single layer or a plurality of layers including a different material from that of the second gate electrode FG. A first insulating layer IL1 may be disposed between the semiconductor layer ACT and the second gate electrode FG, and a second insulating layer IL2 may be disposed between the second gate electrode FG and the first gate electrode CG. The semiconductor layer ACT may include a source region S, a drain region D, and a channel region C. The first gate electrode CG and the second gate electrode FG may overlap the channel region C. In an embodiment, the source region S may be a first terminal and the drain region D may be a second terminal.

The first gate electrode CG may be connected to a first node N1. The first transistor T1 may include a first terminal connected to the driving voltage line PL, and a second terminal connected to the third transistor T3. The driving voltage line PL may transmit the first driving voltage ELVDD to the first transistor T1.

The second transistor T2 (a data write transistor) may be connected between the data line DL and the first node N1. The second transistor T2 may include a gate electrode connected to the gate line GL, a first terminal connected to the data line DL, and a second terminal connected to the first node N1. The second transistor T2 may be turned on in response to the gate signal GS transmitted through the gate line GL and may perform a switching operation of transmitting the data signal DATA supplied from the data line DL to a first node N1.

The third transistor T3 (an emission control transistor) may be connected between the first transistor T1 and the OLED. The third transistor T3 may include a gate electrode connected to the emission control line EL, a first terminal connected to the first transistor T1, and a second terminal connected to a pixel electrode of the OLED. The third transistor T3 may be turned on in response to the emission control signal ES transmitted through the emission control line EL so that a driving current flows through the OLED.

A capacitor Cst may include a first electrode connected to a first gate electrode CG of the first transistor T1 and a second electrode connected to the driving voltage line PL. The capacitor Cst may store and maintain a voltage corresponding to a voltage difference between the driving voltage line PL and the first gate electrode CG of the first transistor T1, thereby maintaining a voltage applied to the first gate electrode CG of the first transistor T1.

The OLED may include a pixel electrode and an opposite electrode, and the second driving voltage ELVSS may be applied to the opposite electrode. The OLED may receive a driving current from the first transistor T1 to emit light, thereby displaying an image.

In an embodiment of the present disclosure, the first transistor T1 that is a driving transistor may include a second gate electrode FG that is a floating electrode, thereby operating like a non-volatile memory device. Thus, the first transistor T1 may store charges for compensating a threshold voltage of the first transistor in the second gate electrode FG, thereby the first transistor T1 may be a threshold voltage compensated driving transistor.

Figure 5:
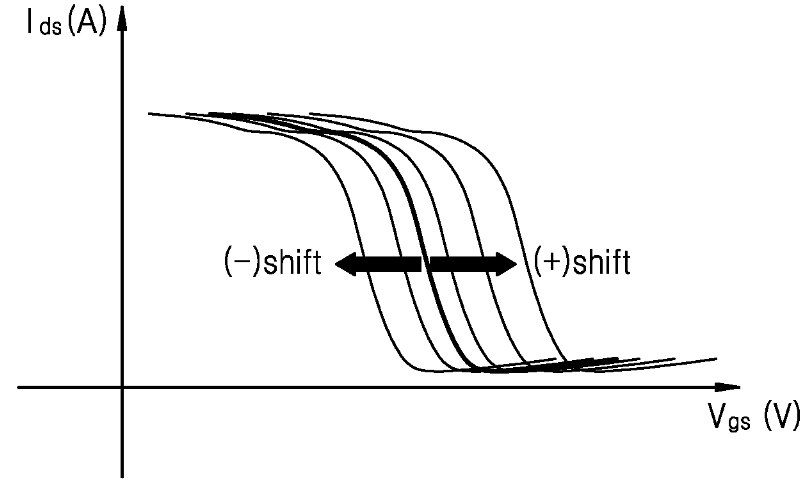
FIG. 5 is a view illustrating a characteristic curve of a driving transistor according to an embodiment.
Figure 6:
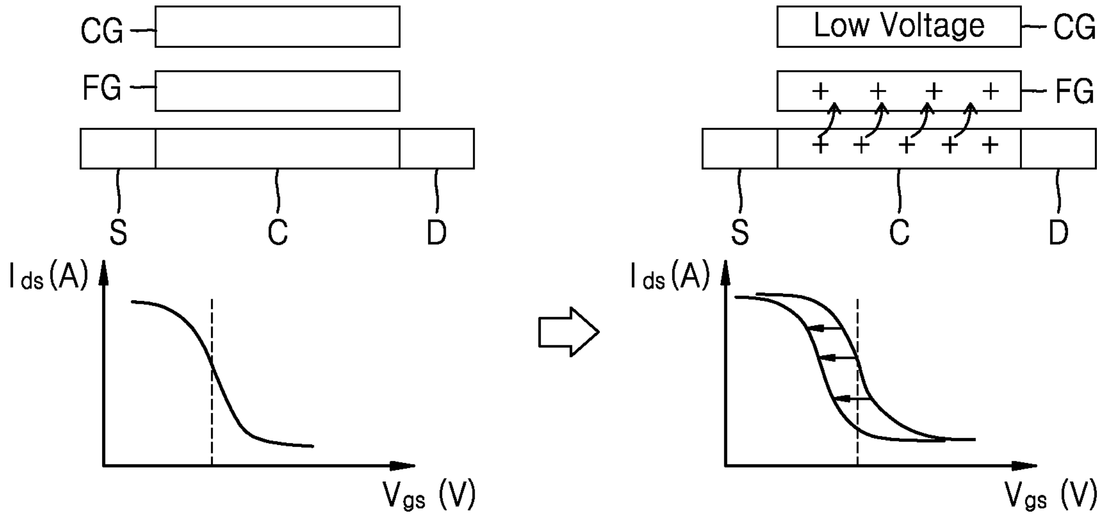
FIG. 6 is a view for describing changes in a threshold voltage according to an embodiment.

FIG. 5 is a view illustrating a characteristic curve of a driving transistor according to an embodiment. FIG. 6 is a view for describing changes in a threshold voltage according to an embodiment.

The characteristic curve shown in FIG. 5 is a graph showing changes in a driving current Ids corresponding to a gate-source voltage Vgs, and the horizontal axis represents a gate-source voltage Vgs of the driving transistor, and the vertical axis represents a driving current Ids of the driving transistor. The characteristic curve may be moved to the right by a positive shift (+ Shift) that increases the threshold voltage of the driving transistor T1, and the characteristic curve may be moved to the left by a negative shift (− Shift) that lowers the threshold voltage of the driving transistor T1.

As shown in FIG. 6, the threshold voltage of the first transistor T1 may be changed by applying a low voltage to the first gate electrode CG and injecting a hole of the channel region C into the second gate electrode FG by tunneling. In this case, the amount of charges stored in the second gate electrode FG and the threshold voltage change amount of the first transistor T1 may be proportional to each other. For example, the greater the amount of charges (holes) stored in the second gate electrode FG (increases), the change amount of the threshold voltage of the first transistor T1, that is, the negative shift of the threshold voltage, may be large.

In the pixel circuit according to an embodiment of the present disclosure, a driving transistor includes a floating gate, and charges for compensating a threshold voltage of the driving transistor (the first transistor T1) is stored in the floating gate, so that there is no need to have a separate transistor for performing a threshold voltage compensation function of the driving transistor.

Figure 7:
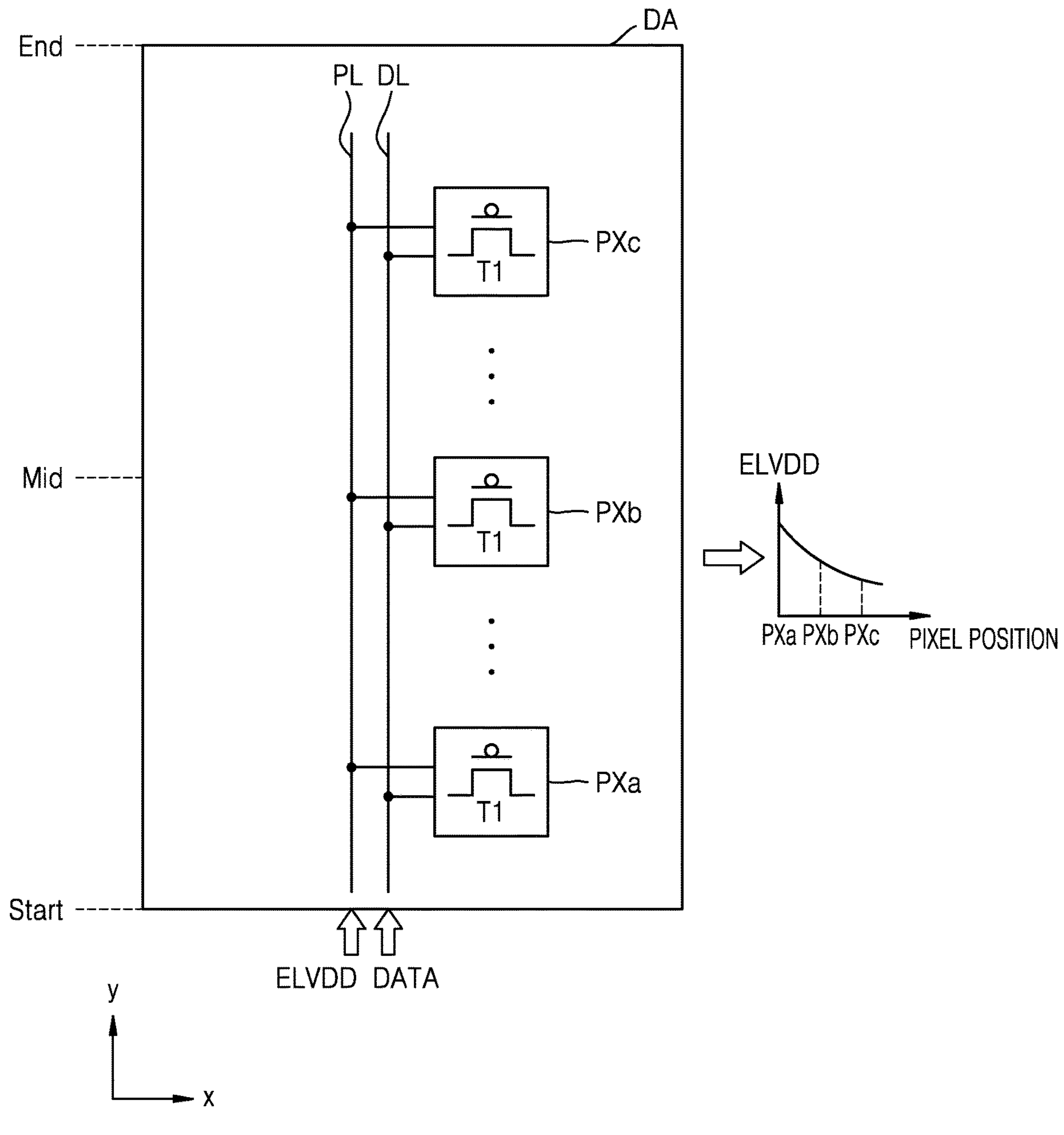
FIG. 7 is a view schematically illustrating pixels arranged in a random column in a display area according to an embodiment.
Figure 8:
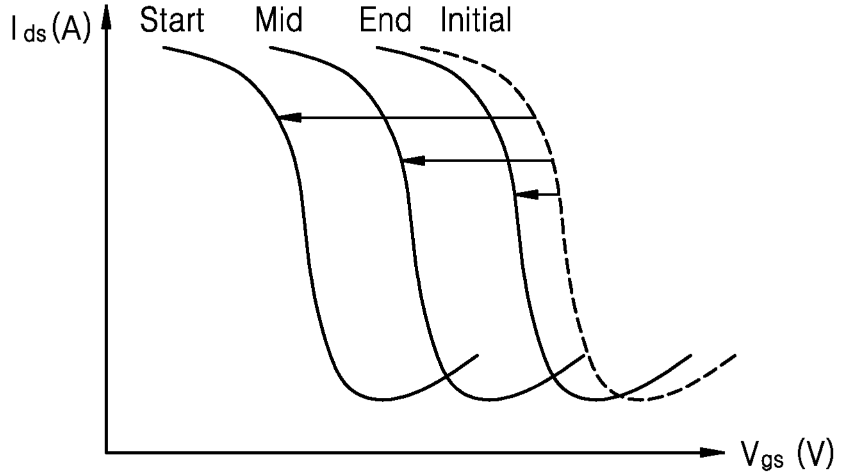
FIG. 8 is a view schematically illustrating a characteristic curve of a driving transistor for each pixel position according to an embodiment.

FIG. 7 is a view schematically illustrating pixels arranged in a random column in a display area according to an embodiment. FIG. 8 is a view schematically illustrating a characteristic curve of a driving transistor for each pixel position according to an embodiment.

Referring to FIG. 7, a driving voltage line PL and a data line DL may extend in the y direction and may be arranged in each column. The pixels PX in each column may be connected to the driving voltage line PL and the data line DL. The first driving voltage ELVDD may be applied to the driving voltage line PL, and the data signal DATA may be applied to the data line DL.

According to the embodiment shown in FIGS. 1 and 2, the first driving voltage ELVDD generated by the power supply circuit 17 may be supplied to the driving voltage line PL via the first voltage supply line 12. Since the driving voltage line PL has a resistance component, a voltage drop may occur in the driving voltage line PL. The voltage drop in the driving voltage line PL may increase as a length of the driving voltage line PL to which the pixel PX is connected increase. A voltage level of the first driving voltage ELVDD at the start portion Start of the display area DA may be higher than a voltage level of the first driving voltage ELVDD at the middle portion Mid of the display area DA due to a voltage drop of the first driving voltage ELVDD, and a voltage level of the first driving voltage ELVDD at the middle portion Mid of the display area DA may be higher than a voltage level of the first driving voltage ELVDD at the end portion End of the display area DA due to a voltage drop of the first driving voltage ELVDD.

Since the first driving voltage ELVDD is supplied from the lower portion to the upper portion of the display panel 10, the voltage level of the first driving voltage ELVDD supplied to a pixel PXa located at the start portion Start of the display area DA, a pixel PXb located at the middle portion Mid of the display area DA, and a pixel PXc located at the end portion End of the display area DA may be gradually lowered.

When the same data signal DATA is supplied to the pixels PX arranged in the same column, the gate-source voltage Vgs of the pixels PX may increase in the +y direction due to the voltage drop of the first driving voltage ELVDD. The +y direction may be a direction in which the first driving voltage ELVDD is transmitted to the driving voltage line PL or the voltage drop direction of the first driving voltage ELVDD.

According to an embodiment of the present disclosure, the threshold voltage of the driving transistor may be adjusted to increase the threshold voltage of the driving transistor of the pixel PX in the voltage drop direction of the first driving voltage ELVDD. A threshold voltage of the driving transistor of the pixel PX may gradually increase in a voltage drop direction of the first driving voltage ELVDD. For example, the threshold voltage of the first transistor T1 of the pixel PXb located at the middle portion Mid of the display area DA may be greater than the threshold voltage of the first transistor T1 of the pixel PXa located at the start portion Start of the display area DA, and the threshold voltage of the first transistor T1 of the pixel PXc located at the end portion End of the display area DA may be greater than the threshold voltage of the first transistor T1 of the pixel PXb located at the middle portion Mid of the display area DA.

Due to the threshold voltage deviation according to the position of the pixel PX in the display area DA, the distribution of a difference (V_DATA−V_ELVDD-Vth) between the gate-source voltage Vgs of the pixel PX and the threshold voltage Vth in the display area DA may be minimized.

According to an embodiment of the present disclosure, a threshold voltage may be adjusted by adjusting a threshold voltage shift degree according to a position of the pixel PX.

A characteristic curve (Vgs–Ids curve) of the driving transistor may be moved according to the threshold voltage shift. For example, as shown in FIG. 8, the characteristic curve (Vgs–Ids curve) of the driving transistor may have a trend of moving to the left in a direction of the horizontal axis in the order of the pixel PXc located at the end portion End of the display area DA, the pixel PXb located at the middle portion Mid of the display area DA, and the pixel PXa located at the start portion Start of the display area DA. A degree of movement of the characteristic curve of the driving transistor from an initial characteristic curve Initial to the left may be increased in the order of the pixel PXc located at the end portion End of the display area DA, the pixel PXb located at the middle portion Mid of the display area DA, and the pixel PXa located at the start portion Start of the display area DA. That is, the threshold voltage of the first transistor T1 may be reduced in the order of the pixel PXc located at the end portion End of the display area DA, the pixel PXb located at the middle portion Mid of the display area DA, and the pixel PXa located at the start portion Start of the display area DA.

Figure 9:
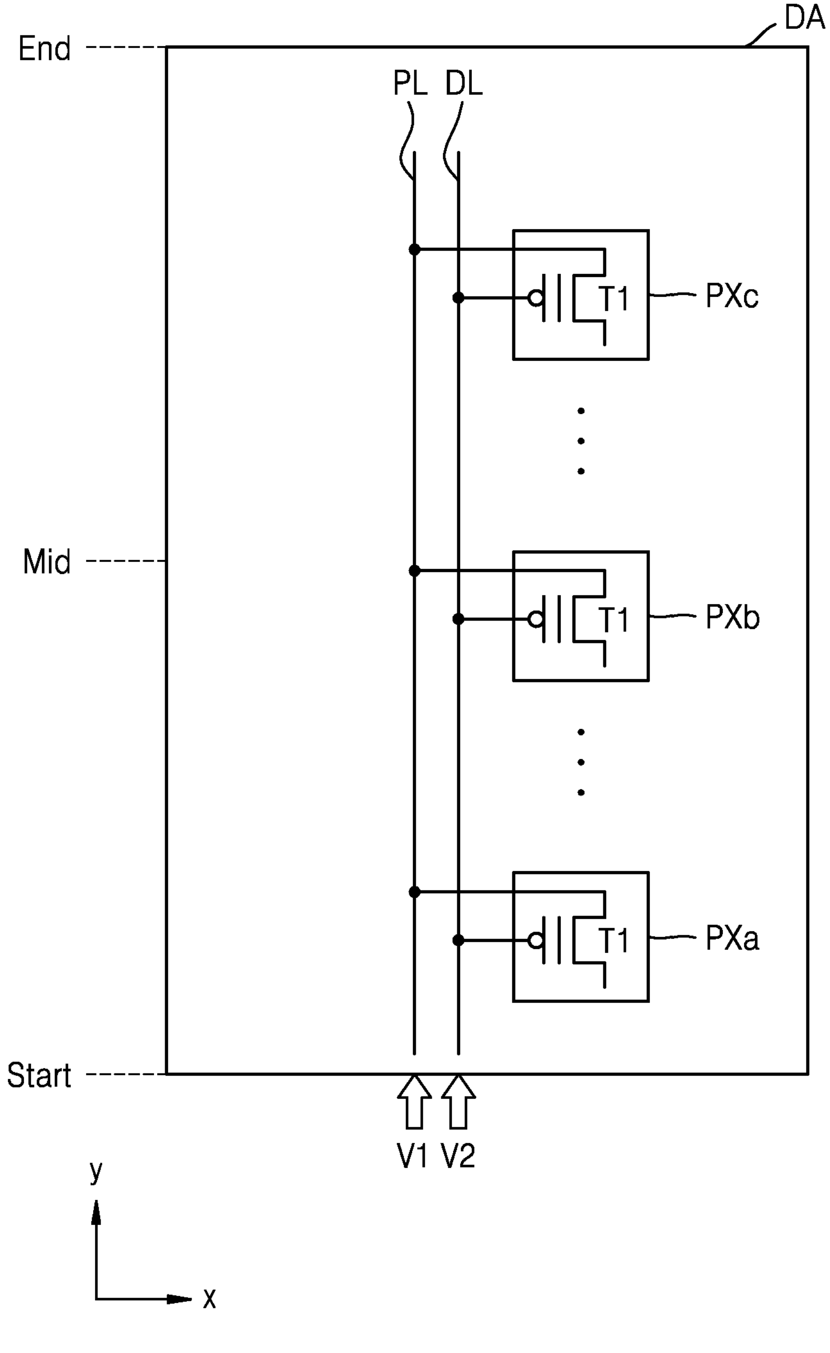
FIG. 9 is a view for describing adjustment of a threshold voltage of pixels for each position according to an embodiment.
Figure 10:
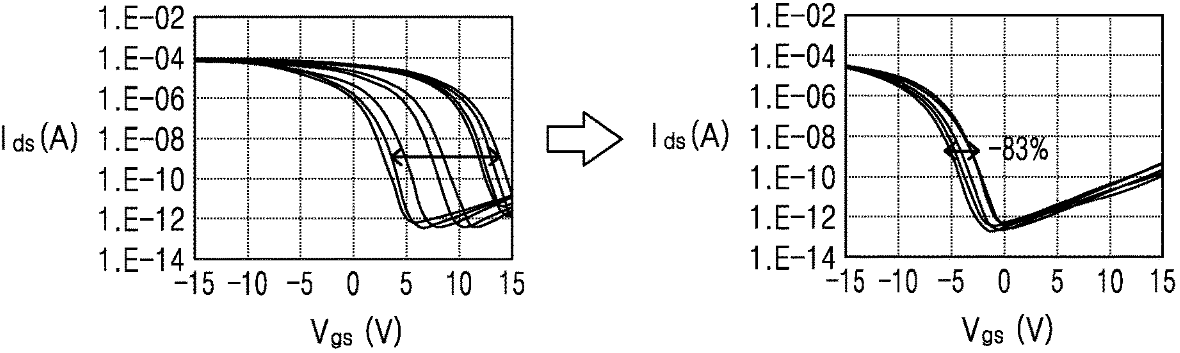
FIG. 10 is a view illustrating a threshold voltage deviation improvement of pixels for each position according to adjustment of the threshold voltage of FIG. 9.

FIG. 9 is a view for describing adjustment of a threshold voltage of pixels for each position according to an embodiment. FIG. 10 is a view illustrating a threshold voltage deviation improvement of pixels for each position according to adjustment of the threshold voltage of FIG. 9.

As described with reference to FIG. 6, the compensation of the threshold voltage of the driving transistor may be performed by storing certain charges (e.g., by changing holes) in the floating electrode FG to have a predetermined potential by applying a low voltage to the control electrode of the driving transistor. According to an embodiment of the present disclosure, the threshold voltage of the driving transistor for each position of the pixel may be adjusted by adjusting the voltage applied to the control electrode and the source electrode of the driving transistor, that is, the gate-source voltage Vgs of the driving transistor.

For example, as shown in FIG. 9, a first voltage V1 may be applied to a driving voltage line PL connected to pixels in the same column, and a second voltage V2 may be applied to a data line DL. In FIG. 9, only the first transistor T1, which is a driving transistor, is illustrated for convenience of illustration, and a second transistor T2 connected between the first gate electrode CG of the first transistor T1 and the data line DL, a third transistor T3, and a capacitor Cst are omitted.

Since the first voltage V1 is supplied from a lower portion to an upper portion of the display area DA, a voltage level of the first voltage V1 may decrease from the start portion Start to the end portion End of the display area DA due to a voltage drop of the first voltage V1. Thus, a difference between a voltage (the second voltage V2) of the first gate electrode CG and the source voltage (the first voltage (V1) of the first transistor T1 decreases from the start portion Start of the display area DA toward the end portion End of the display area DA, and the amount of charges stored in the second gate electrode FG of the first transistor T1 may be reduced. Thus, as shown in FIG. 8, the change (negative shift) of the threshold voltage of the first transistor T1 may decrease from the start portion Start to the end portion End of the display area DA, and the movement of the characteristic curve to the left direction may decrease. Thus, the threshold voltage of the first transistor T1 may increase from the start portion Start toward the end portion End of the display area DA.

According to an embodiment of the present disclosure, the threshold voltage of the first transistor T1 may be differently adjusted for each pixel position by supplying a first voltage V1 to a source of the first transistor T1 using a driving voltage line PL, and a second voltage V2 to a gate of the first transistor T1 by using a data line DL, simultaneously to the first transistors T1 of the pixels PX arranged in one column in the voltage drop direction of the first driving voltage ELVDD.

According to an embodiment of the present disclosure, the adjustment of the threshold voltage of the pixels PX of the display area DA may be performed in the inspection step of the display panel. For example, in an aging operation of the display panel before shipment, as shown in FIG. 9, high voltage aging may be performed by applying voltages having a large potential difference to the data line DL and the driving voltage line PL to store the threshold voltage compensation value of the driving transistor in the second gate electrode FG of the driving transistor, thereby adjusting the threshold voltage of the pixels PX. At this time, the threshold voltage may be adjusted by adjusting the threshold voltage shift degree for each pixel position by considering the voltage drop of the first driving voltage ELVDD supplied from the driving voltage line PL.

The left side of FIG. 10 shows initial characteristic curves of 9 pixels in a 3×3 area in the display area DA, and the right side of FIG. 10 shows changed characteristic curves when a first voltage V1 of 0V and a second voltage V2 of −84V are supplied to 9 pixels in a 3×3 area for 60 seconds. In the case of the right side of FIG. 10, the voltage of the drain electrode of the first transistors T1 is maintained at −0.1 V. It can be seen from FIG. 10 that the deviation of the characteristic curves, that is, the threshold voltage deviation of the driving transistors of the pixels arranged at different positions, is reduced by 83%.

The distribution difference of the driving currents of the pixels may be due to the distribution difference of manufacturing process of transistors and capacitors for driving pixels. This distribution difference of the driving currents of the pixels may be expressed as luminance non-uniformity. Thus, it is necessary to improve the current distribution difference of the transistors to improve luminance non-uniformity. The display panel may include conductive lines including a voltage line and/or a signal line extending from a lower end of the panel to an upper end of the panel, and the conductive lines may have a voltage drop problem due to a resistance component of the conductive lines.

According to an embodiment of the present disclosure, a threshold voltage of a driving transistor may be gradually adjusted in a voltage drop direction of a driving voltage or a voltage drop direction of a difference (V_DATA−V_ELVDD) between the data voltage and the driving voltage so that Long Range Uniformity (LRU) issue of brightness may be prevented. Also, the distribution difference of the threshold voltage may be reduced by using the floating gate electrode of the driving transistor. Therefore, luminance non-uniformity may be improved without a complex compensation circuit such as a compensation transistor or a source follower which diode-connects the driving transistor.

According to embodiments of the present disclosure, luminance non-uniformity may be minimized by adjusting a threshold voltage for each position of a pixel so that a display apparatus having improved display quality may be provided. Of course, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a data line extending in a first direction;
a driving voltage line extending in the first direction; and
a plurality of pixels connected to the data line and the driving voltage line, and arranged adjacent to each other in the first direction,
wherein threshold voltages of driving transistors of the plurality of pixels arranged in the first direction are gradually changing.

2. The display apparatus of claim 1,
wherein threshold voltages of the driving transistors of the plurality of pixels gradually increase along a transmission direction of a driving voltage supplied from the driving voltage line.

3. The display apparatus of claim 1, wherein each of the driving transistors comprises a semiconductor layer, a first gate electrode, and a second gate electrode disposed between the semiconductor layer and the first gate electrode.

4. The display apparatus of claim 3, wherein an amount of charges stored in second gate electrodes of the plurality of pixels decreases along a transmission direction of a driving voltage supplied from the driving voltage line.

5. The display apparatus of claim 3, wherein each of the plurality of pixels further comprises:
a first transistor connected between the data line and a first gate electrode of the driving transistor; and
a second transistor connected between the driving transistor and a light-emitting diode, and
wherein the driving transistor is connected between the driving voltage line and the second transistor.

6. The display apparatus of claim 3, wherein the second gate electrode is a floating electrode.

7. The display apparatus of claim 1, wherein each of the driving transistors is a P-channel transistor.

8. The display apparatus of claim 1, wherein a voltage level of a driving voltage supplied from the driving voltage line decreases along a transmission direction of the driving voltage supplied from the driving voltage line.

9. A display apparatus comprising:
a data line extending in a first direction;
a driving voltage line extending in the first direction; and
a plurality of pixels connected to the data line and the driving voltage line and arranged adjacent to each other in the first direction,
wherein voltage-current curves of driving transistors of the plurality of pixels arranged in the first direction are gradually shifting along a direction of the horizontal axis.

10. The display apparatus of claim 9, wherein the voltage-current curves of the driving transistors of the plurality of pixels move to a left of the horizontal axis along the transmission direction of a driving voltage supplied from the driving voltage line.

11. The display apparatus of claim 9, wherein the driving transistor is a P-channel transistor.

12. The display apparatus of claim 9, wherein each of the driving transistors comprises a semiconductor layer, a first gate electrode, and a second gate electrode disposed between the semiconductor layer and the first gate electrode.

13. The driving apparatus of claim 12, wherein the second gate electrode is a floating electrode.

14. The driving apparatus of claim 12, wherein an amount of charges stored in second gate electrodes of the plurality of pixels decreases along a transmission direction of a driving voltage supplied from the driving voltage line.

15. The display apparatus of claim 12, wherein each of the plurality of pixels further comprises:
a first transistor connected between the data line and a first gate electrode of the driving transistor;
a second transistor connected between the driving transistor and a light-emitting diode; and
a capacitor connected between a first gate electrode of the driving transistor and the driving voltage line, and
wherein the driving transistor is connected between the driving voltage line and the second transistor.

16. The display apparatus of claim 9, wherein threshold voltages of the driving transistors of the plurality of pixels gradually increase along a transmission direction of a driving voltage supplied from the driving voltage line.

17. A display apparatus comprising:
a pixel unit comprising a plurality of pixels;
a data driver connected to data lines connected to the plurality of pixels; and
a power supply circuit connected to driving voltage lines connected to the pixels,
wherein each of the plurality of pixels comprises:
a first transistor connected between a corresponding driving voltage line of the driving voltage lines and a light-emitting diode, and comprising a first gate electrode and a second gate electrode;
a second transistor connected to a corresponding data line of the data lines and a first gate electrode of the first transistor; and
a third transistor connected between the first transistor and the light-emitting diode, and
wherein threshold voltages of the first transistors of the plurality of pixels are gradually changing along a transmission direction of a driving voltage supplied from the driving voltage line.

18. The driving apparatus of claim 17, wherein amount of charges stored in second gate electrodes of the plurality of pixels decreases along a transmission direction of the driving voltage supplied from the driving voltage line.

19. The driving apparatus of claim 17, wherein the second gate electrode is a floating electrode.

20. The driving apparatus of claim 17, wherein the first transistor is a P-channel transistor, and
wherein the threshold voltages of the first transistors of the plurality of pixels gradually increase along the transmission direction of the driving voltage supplied from the driving voltage line.

* * * * *